(12) United States Patent
Kondou

(10) Patent No.: US 8,008,955 B2
(45) Date of Patent: Aug. 30, 2011

(54) SEMICONDUCTOR DEVICE

(75) Inventor: Masafumi Kondou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/753,471

(22) Filed: Apr. 2, 2010

(65) Prior Publication Data

US 2010/0259307 A1 Oct. 14, 2010

(30) Foreign Application Priority Data

Apr. 10, 2009 (JP) ................................. 2009-096500

(51) Int. Cl.
*H03L 7/06* (2006.01)
(52) U.S. Cl. ........................................ 327/156; 327/147
(58) Field of Classification Search .................. 327/149, 327/158
See application file for complete search history.

(56) References Cited

U.S. PATENT DOCUMENTS

| | | | | |
|---|---|---|---|---|
| 3,902,121 A * | 8/1975 | Yoshino et al. | ............ | 455/183.1 |
| 5,909,474 A * | 6/1999 | Yoshizawa | .................... | 375/376 |
| 6,100,767 A * | 8/2000 | Sumi | ............................... | 331/11 |
| 6,553,089 B2 | 4/2003 | Huh et al. | | |
| 6,704,383 B2 | 3/2004 | Lee et al. | | |
| 7,050,525 B2 * | 5/2006 | Adachi et al. | ................. | 375/376 |
| 7,110,486 B2 * | 9/2006 | Adachi et al. | ................. | 375/376 |
| 7,482,885 B2 * | 1/2009 | Sridharan | ....................... | 331/49 |
| 7,519,349 B2 * | 4/2009 | Sridharan | ...................... | 455/285 |
| 7,623,609 B2 * | 11/2009 | Chang et al. | .................. | 375/355 |
| 7,898,345 B2 * | 3/2011 | Sridharan | ....................... | 331/49 |
| 2002/0136341 A1 | 9/2002 | Huh et al. | | |
| 2002/0136342 A1 | 9/2002 | Lee et al. | | |
| 2010/0259307 A1 * | 10/2010 | Kondou | ....................... | 327/157 |

FOREIGN PATENT DOCUMENTS

| | | |
|---|---|---|
| JP | 2004-530334 T | 9/2004 |
| JP | 2007-288375 A | 11/2007 |

* cited by examiner

*Primary Examiner* — Lincoln Donovan
*Assistant Examiner* — Adam D Houston
(74) *Attorney, Agent, or Firm* — Arent Fox LLP

(57) ABSTRACT

There is provided a semiconductor device having a voltage-controlled oscillator outputting an output clock signal; N pieces of control units generating a frequency-divided clock signal by frequency-dividing the output clock signal, comparing a reference clock signal and the frequency-divided clock signal, and outputting an output signal based on a comparison result; an adder adding output signals from each of the control units; and a low-pass filter filtering an output of the adder and outputting to the voltage-controlled oscillator, wherein setting information related to a frequency division ratio made of N pieces of data cycled and supplied in a sequence in synchronization with the frequency-divided clock signal is supplied to each of the control units with initial values made different from one another and a frequency-division operation and a comparison operation are performed thereby to form a moving average filter by N pieces of control units and to reduce a quantization noise, so that occurrence of a spurious in the output clock signal can be suppressed.

10 Claims, 11 Drawing Sheets

F I G. 12
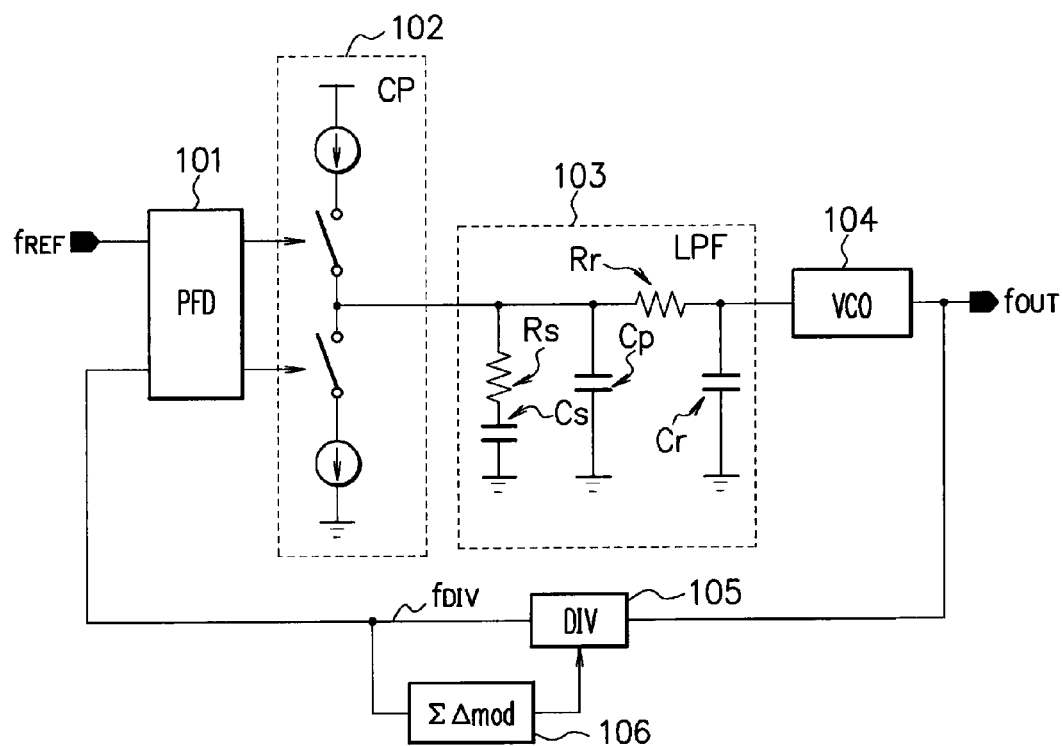
F I G. 13
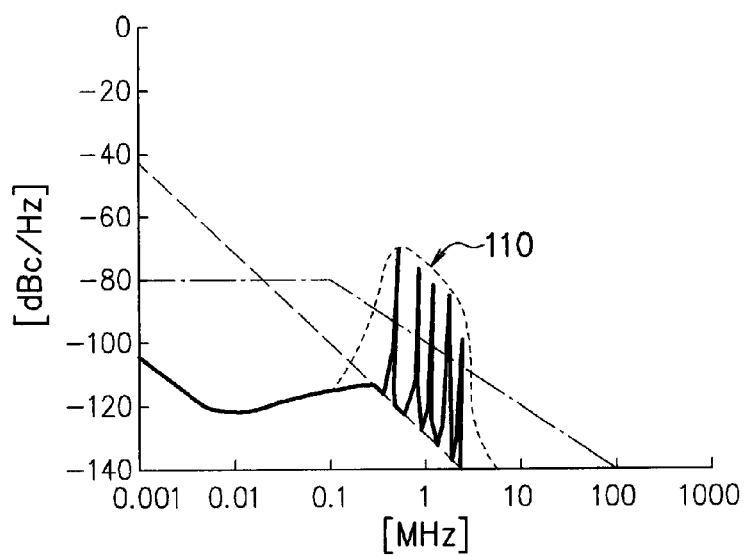

SEMICONDUCTOR DEVICE

CROSS-REFERENCE TO RELATED APPLICATIONS

This application is based upon and claims the benefit of priority of the prior Japanese Patent Application No. 2009-096500, filed on Apr. 10, 2009, the entire contents of which are incorporated herein by reference.

FIELD

The embodiment discussed herein is directed to a semiconductor device having a PLL (Phase Locked Loop) circuit.

BACKGROUND

For a frequency synthesizer used in a communication system, one that can output various frequency signals is required. In particular, as a communicable band is being fragmented, it is necessary that a frequency step of an output can be finely set in the frequency synthesizer. In a frequency synthesizer used in a communication system, it is general to use a PLL (Phase Locked Loop) circuit.

As a PLL circuit, an integer frequency division type PLL circuit (integer-N PLL) in which a frequency division ratio is integer only is generally known. In the integer-N PLL circuit, in order that a frequency division ratio for obtaining an output of a desired frequency becomes integer, a signal with a lower frequency obtained by frequency-dividing a clock signal inputted from the outside is set as a standard signal (reference clock signal). However, when a frequency of the reference clock signal, that is, a comparison frequency related to phase comparison, becomes low, a cut-off frequency of a loop filter (low-pass filter) is also necessary to be reduced. Thus, it is inevitable to increase a capacitance value of a capacitance in the loop filter, thereby increasing a circuit area. Further, a narrowed loop band leads to decrease of a phase noise reduction effect.

As one of methods of preventing lowering of the comparison frequency related to phase comparison as described above, there is suggested a fractional frequency division type PLL circuit called a fractional-N PLL circuit, an example of which is illustrated in FIG. 12. The fractional-N PLL circuit temporally changes an integer frequency division number in a frequency divider. In other words, the fractional-N PLL circuit gives disturbance to a frequency division ratio in relation to a time axis thereby to realize a frequency division ratio including not only an integer but also a fraction (decimal fraction) equivalently and averagely.

FIG. 12 is a diagram illustrating a constitution example of a fractional-N PLL circuit.

In FIG. 12, a reference numeral 101 indicates a phase frequency comparator (PFD), a reference numeral 102 indicates a charge pump circuit (CP), a reference numeral 103 indicates a low-pass filter (LPF), a reference numeral 104 indicates a voltage-controlled oscillator (VCO), a reference numeral 105 indicates a variable frequency divider (DIV), and a reference numeral 106 indicates a ΣΔ modulator (ΣΔ mod).

To the phase frequency comparator 101, a reference clock signal $f_{REF}$ is inputted and a frequency-divided clock signal $f_{DIV}$ outputted from the variable frequency divider 105 is inputted. The phase frequency comparator 101 outputs a pulse signal corresponding to a frequency difference and a phase difference between the reference clock signal $f_{REF}$ and the frequency-divided clock signal $f_{DIV}$ to the charge pump circuit 102. The charge pump circuit 102 outputs an output signal corresponding to the pulse signal outputted from the phase frequency comparator 101 to the low-pass filter 103.

The low-pass filter (loop filter) 103 has resistances Rs, Rr and capacitances Cs, Cp, Cr, as illustrated in FIG. 12. The low-pass filter 103 smoothes an output signal of the charge pump circuit 102 thereby to remove a high frequency component and outputs to the voltage-controlled oscillator 104 as a control voltage. The voltage-controlled oscillator 104 outputs an output clock signal $f_{OUT}$ of a frequency corresponding to an inputted control voltage to the external circuit and outputs to the variable frequency divider 105.

The variable frequency divider 105 frequency-divides the output clock signal $f_{OUT}$ outputted from the voltage-controlled oscillator 104 and outputs a frequency-divided clock signal $f_{DIV}$. A frequency division ratio of the variable divider 105 is set based on an output of the ΣΔ modulator 106. The ΣΔ modulator 106 outputs setting information related to the frequency division ratio of the variable frequency divider 105 in correspondence with the frequency-divided clock signal $f_{DIV}$ outputted from the variable frequency divider 105.

The fractional-N PLL circuit illustrated in FIG. 12 temporally changes the frequency division ratio (integer frequency division number) of the variable frequency divider 105 based on the output of the ΣΔ modulator 106, and performs a frequency division operation in which an average frequency division ratio includes a fraction. The fractional-N PLL circuit is capable of setting a fractional value as a frequency division ratio (average frequency division ratio), whereby a frequency of a reference clock signal, that is, a comparison frequency related to phase comparison, can be made higher than in a case of using an integer-N PLL circuit. In other words, it becomes possible to obtain an output of a desired frequency without lowering a comparison frequency related to phase comparison, and it becomes possible to reduce a capacitance value of a capacitance in a low-pass filter compared with in an integer-N PLL circuit. Further, as for a loop band, it also becomes possible to maintain a broad band, whereby it becomes possible to maintain a phase noise reduction effect.

However, in the fractional-N PLL circuit illustrated in FIG. 12, a spurious 110 occurs due to a quantization noise caused by an operation of the ΣΔ modulator 106 in the output clock signal $f_{OUT}$ from the voltage-controlled oscillator 104, as illustrated in FIG. 13. In FIG. 13, a solid line indicates a level of the phase noise of the fractional-N PLL circuit, while a dotted line indicates a level in a case of only with the voltage-controlled oscillator.

As a method of suppressing occurrence of the spurious 110 in the output clock signal $f_{OUT}$ as illustrated in FIG. 13, increasing a capacitance value of a capacitance in a low-pass filter in the fractional-N PLL circuit can be considered. However, in order to sufficiently suppress the occurrence of the spurious, a capacitance value nearly equal to that of the integer-N PLL circuit is necessary as a capacitance value of the capacitance in the low-pass filter, and thus an advantage of the fractional-N PLL circuit is impaired.

Further, there is suggested a fractional-N PLL circuit constituted so that a cycle-to-cycle jitter of a fractional-N PLL circuit can be reduced (for example, see Patent Document 1). In this fractional-N PLL circuit, at least one of a phase frequency comparator and a charge pump circuit is constituted so that a generation operation of an output voltage of a loop filter to be outputted to a voltage-controlled oscillator based on a phase difference detection operation between a phase of one pulse in a reference clock signal and a phase of one pulse in a frequency-divided clock signal which is compared with the pulse in the reference clock is performed by a plurality of generation operations having time differences. Then, the generation operation of the output voltage of the loop filter based on a phase difference detection operation between the phase of one pulse in the reference clock signal and the phase of one pulse in the frequency-divided clock signal is performed in a plurality of operations divided by a time axis during the one pulse time period. As stated above, by dividing the generation operation of the output voltage of the loop filter into the plural operations during one pulse time period, an overshoot amount of the output voltage is reduced and the cycle-to-cycle jitter is reduced.

Further, there is suggested a fractional-N PLL circuit which generates, by a frequency divider, a first frequency-divided clock signal and a second frequency-divided clock signal having a predetermined phase relationship by frequency-dividing an oscillation output of a voltage-controlled oscillator, and which controls a control voltage to be supplied to the voltage-controlled oscillator in correspondence with a comparison result of a reference clock signal and the first frequency-divided clock signal as well as a comparison result of the reference clock signal and the second frequency-divided clock signal (for example, see Patent Document 2).

[Patent Document 1] Japanese Laid-open Patent Publication No. 2007-288375

[Patent Document 2] Japanese National Publication of International Patent Application No. 2004-530334

SUMMARY

According to an aspect of the present embodiment, there is provided a semiconductor device having a voltage-controlled oscillator outputting an output clock signal; N pieces (N is a natural number equal to or more than 2) of control circuit sections to which a reference clock signal and the output clock signal are inputted; an adder adding output signals from each of the control circuit sections; and a low-pass filter filtering an output of the adder and outputting to the voltage-controlled oscillator.

The control circuit section has a variable frequency divider, a phase frequency comparator, and a charge pump circuit. The variable frequency divider frequency-divides an output clock signal at a frequency division ratio corresponding to setting information to be supplied and outputs a frequency-divided clock signal. The phase frequency comparator compares a reference clock signal and the frequency-divided clock signal. The charge pump circuit outputs an output signal based on a comparison result of the phase frequency comparator. The setting information related to the frequency division ratio is N pieces of data which are cycled and supplied in a predetermined sequence in synchronization with the frequency-divided clock signal and in which the frequency division ratio is fluctuated so that an average frequency division ratio may include a decimal fraction, and is supplied to each of the variable frequency dividers of the control circuit sections with initial values thereof made different from one another.

According to the aforementioned constitution, the setting information related to the frequency division ratio is supplied to each control circuit section with the initial value made different from one another and then a frequency division operation and a comparison operation are performed, whereby control related to the output clock signal is performed based on a signal made by adding output signals outputted from each of the control circuit sections.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram illustrating an example of a fractional-N PLL circuit; and

FIG. 13 is a graph illustrating a phase noise in the fractional-N PLL circuit illustrated in FIG. 12.

DESCRIPTION OF EMBODIMENTS

Hereinafter, an embodiment will be described based on the drawings.

A semiconductor device according to an embodiment is a fractional frequency division type PLL circuit, what is called a fractional-N PLL circuit. The fractional-N PLL circuit in the present embodiment is capable of realizing a frequency division ratio which includes a fraction (decimal fraction) equivalently and averagely by temporally changing (giving disturbance to a frequency division number in relation to a time axis) a frequency division number (integer frequency division number) in a frequency divider in the fractional-N PLL circuit. In the present embodiment, it is presumed that a denominator value of a fractional frequency division ratio set to the fractional-N PLL circuit is determined in advance and that a cyclic period of setting information related to the frequency division ratio to be given to the frequency divider in the fractional-N PLL circuit to realize the frequency division ratio is known.

Figure 1:
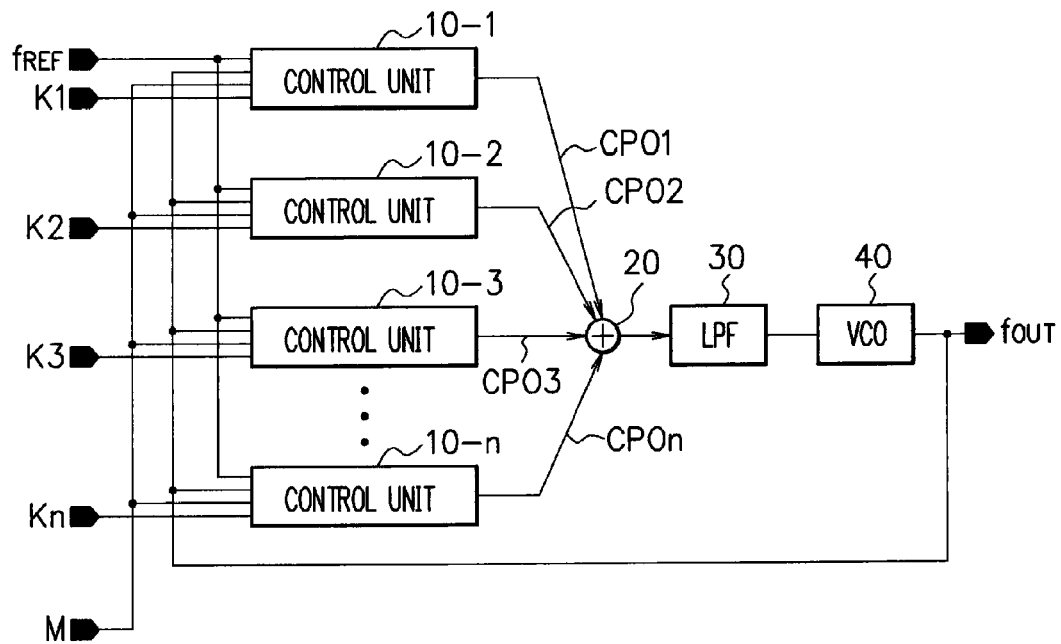
FIG. 1 is a diagram illustrating a constitution example of a fractional-N PLL circuit in an embodiment.

FIG. 1 is a block diagram illustrating a constitution example of the fractional-N PLL circuit in the present embodiment. In FIG. 1, a fractional-N PLL circuit is illustrated as an example in which a denominator value of a fractional frequency division ratio to be set is n (n is a natural number) and setting information related to a frequency division ratio to be given to a frequency divider is cycled in n periods of a frequency-divided signal outputted from the frequency divider.

In FIG. 1, a reference numeral 10-$i$ indicates a control unit, a reference numeral 20 indicates an adder, a reference numeral 30 indicates a low-pass filter (LPF), and a reference numeral 40 indicates a voltage-controlled oscillator (VCO). It should be noted that "i" is a subscript, being a natural number and i=1 to n.

Figure 2:
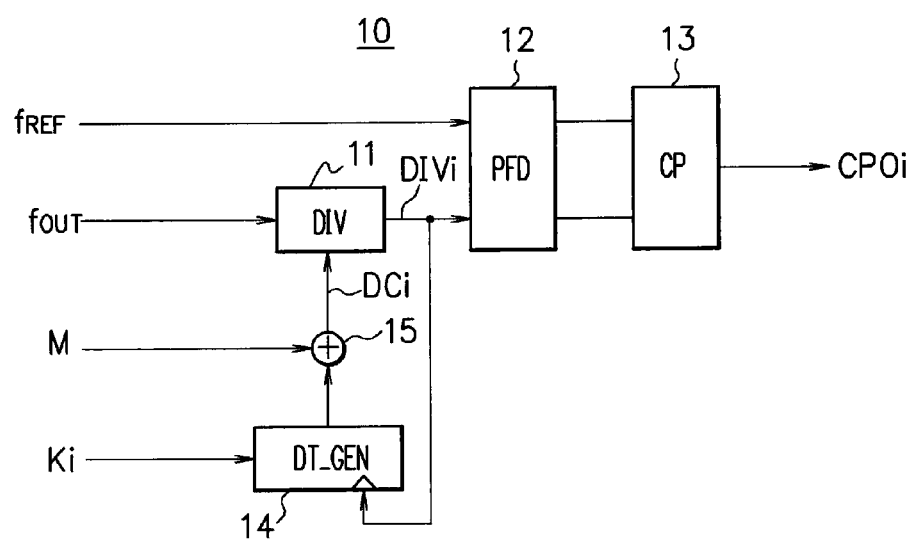
FIG. 2 is a diagram illustrating a constitution example of a control unit in the present embodiment.

In a case that the denominator value of the fractional frequency division ratio to be set is n and a cyclic period of the setting information related to the frequency division ratio given to the frequency diver is n periods of the frequency-divided clock signal, n pieces of control units 10-$i$ are provided in parallel. Each of the control units 10-$i$ has, as illustrated in FIG. 2, a variable frequency divider (DIV) 11, a phase frequency comparator (PFD) 12, a charge pump circuit (CP) 13, a data generator (DT—GEN) 14, and an adder 15.

To each control unit 10-$i$, a reference clock signal $f_{REF}$, an output clock signal $f_{OUT}$ being an oscillation output outputted from the voltage-controlled oscillator 40, a fixed frequency division setting value M, and an initial value address Ki are inputted. Here, the reference clock signal $f_{REF}$ is a signal generated based on a standard signal with a constant frequency, the standard signal outputted from a not-illustrated oscillator using a quartz resonator and the like.

To the variable frequency divider (fractional frequency divider) 11, the output clock signal $f_{OUT}$ is inputted and a frequency division number setting value DCi indicating a frequency division ratio (frequency division number) to be set is inputted. The variable frequency divider 11 frequency-divides the output clock signal $f_{OUT}$ by the frequency division ratio set based on the frequency division number setting value DCi and outputs a frequency-divided clock signal (output feedback signal) DIVi.

The frequency division number setting value DCi sets a momentary frequency division ratio in the variable frequency divider 11 by an integer, and its value changes temporally. The frequency division number setting value DCi is supplied to the variable frequency divider 11 in synchronization with the frequency-divided clock signal DIVi and is cycled to make a round in n periods of the frequency-divided clock signal DIVi.

To the phase frequency comparator 12, the reference clock signal $f_{REF}$ is inputted and the frequency-divided clock signal DIVi outputted from the variable frequency divider 11 is inputted. The phase frequency comparator 12 outputs a pulse signal corresponding to a frequency difference and a phase difference between the reference clock signal $f_{REF}$ and the frequency-divided clock signal DIVi to the charge pump circuit 13.

The charge pump circuit 13 outputs an output signal CPOi corresponding to a pulse signal outputted from the phase frequency comparator 12. The output signal CPOi is a signal in which a pulse component changing based on a phase difference of pulse signals is included in a direct-current component changing with a frequency fluctuation of the pulse signal.

The charge pump circuit 13 is constituted similarly to the charge pump circuit 102 illustrated in FIG. 12 for example. In other words, the charge pump circuit 13 is constituted by a series circuit composed of a first charge pump current source and an input switch disposed between a first power source and an output terminal, and a series circuit composed of a second charge pump current source and an output switch disposed between the output terminal and a second power source. The charge pump circuit 13 outputs the output signal CPOi to the output terminal as a result that the input switch and the output switch are controlled to be turned on/off in correspondence with the pulse signal outputted from the phase frequency comparator 12.

The frequency-divided clock signal DIVi outputted from the variable frequency divider 11 is inputted to the data generator (data generation circuit) 14. The data generator 14 operates based on the inputted frequency-divided clock signal DIVi as a clock signal and outputs a variable frequency division setting value in synchronization with the frequency-divided clock signal DIVi.

The variable frequency division setting value is constituted by n pieces of data to which sequence (order) is specified. The data generator 14, with data corresponding to an inputted initial value address Ki used as an initial value, sequentially outputs the n pieces of data in accordance with the specified sequence, in synchronization with the frequency-divided clock signal DIVi. Further, when the data generator 14 outputs the last-th data, the data generator 14 outputs the first data next, thereby to output the data constituting the variable frequency division setting value in cycle.

To the adder 15, the fixed frequency division setting value M is inputted and the variable frequency division setting value outputted from the data generator 14 is inputted. The adder 15 adds the fixed frequency division setting value M and the variable frequency division setting value and outputs an addition result as a frequency division number setting value DCi to the variable frequency divider 11.

Here, in the control units 10-1 to 10-$n$, though the n pieces of data constituting the variable frequency division setting values are the same for all the control units 10-1 to 10-$n$, initial value addresses K1 to Kn to be inputted to each of the control units 10-1 to 10-$n$ are different from one another. That is, the variable frequency division setting values outputted from the data generator 14, in other words, the frequency division number setting values DCi inputted to the variable frequency divider 11, are the same in terms of data alignment (data pattern) as a whole, but initial values are different from one another as in an example illustrated in FIG. 3.

Figure 3:
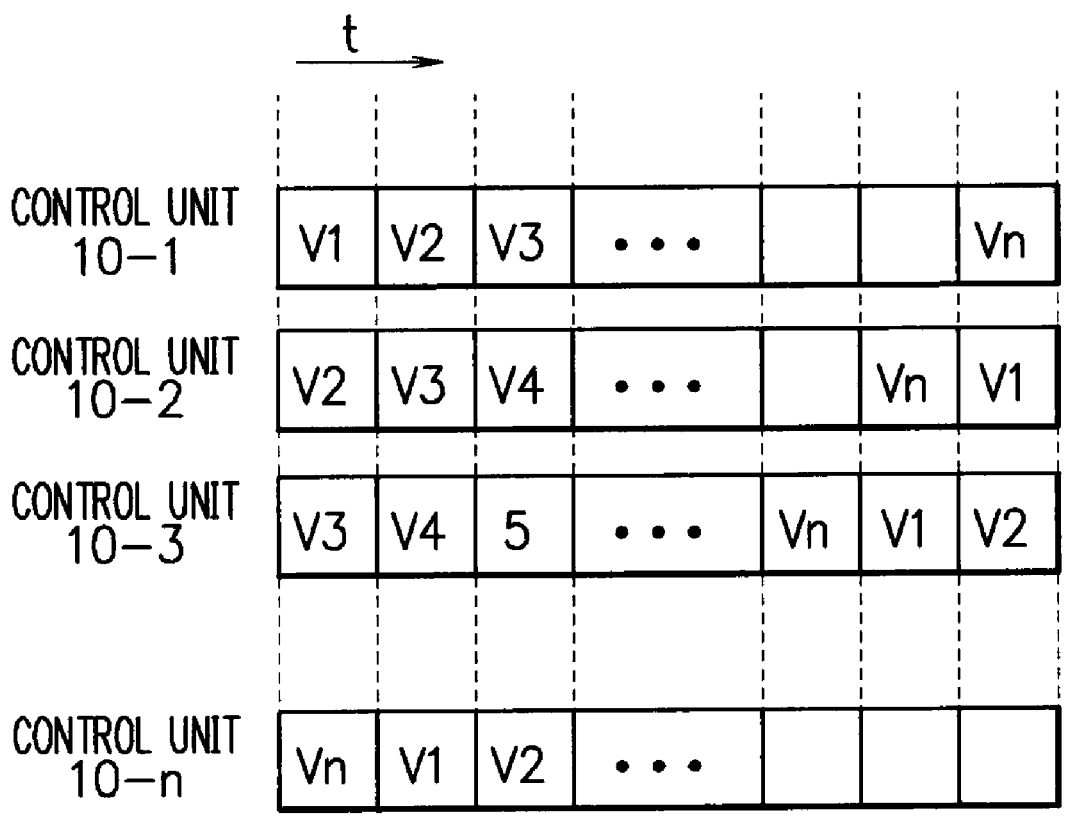
FIG. 3 is a diagram illustrating an example of a frequency division number setting value supplied to a variable frequency divider in each control unit.

FIG. 3 is a diagram illustrating an example of a frequency division number setting value DCi (variable frequency division setting value outputted from the data generator 14) supplied to the variable frequency divider 11 of each control unit 10-$i$. It should be noted that a time period of the first period to a time period of the n-th period of the frequency-divided clock signal DIVi are illustrated in FIG. 3, and as for time periods thereafter, the same are repeated as in the time period of the first period to the time period of the n-th period which are illustrated in FIG. 3.

For a frequency division setting value DC1 supplied to the variable frequency divider 11 in the control unit 10-1, a value V1 is supplied as an initial value in the time period of the first period of the frequency-divided clock signal DIV1, a value V2 is supplied in the time period of the second period, and a value V3 is supplied in the time period of the third period. Further, a value Vn is supplied in the time period of the n-th period of the frequency-divided clock signal DIV1.

Further, as for a frequency division number setting value DC2 supplied to the variable frequency divider 11 in the control unit 10-2, with an initial value being a value V2, values V2, V3, . . . , Vn, V1 are sequentially supplied in synchronization with a frequency-divided clock signal DIV2. Similarly, as for a frequency division number setting value DC3 supplied to the variable frequency divider 11 in the control unit 10-3, with an initial value being a value V3, values V3, V4, . . . , Vn, V1, V2 are sequentially supplied in synchronization with a frequency-divided clock signal DIV3.

Further, as for a frequency division number setting value DCn supplied to the variable frequency divider 11 in the control unit 10-*n*, with an initial value being a value Vn, values Vn, V1, V2, . . . are sequentially supplied in synchronization with a frequency-divided clock signal DIVn.

In other words, a value V(j+i−1)(a value V(j+i−1−n) in a case of j+i−1>n) is supplied to the variable frequency divider 11 in the control unit 10-*i* as the frequency number setting value DCi in a time period of the j-th period of the frequency-divided clock signal DIVi. It should be noted that "j" is a subscript, being a natural number, and j=1 to n. Therefore, in a time period of a certain period of a frequency-divided clock signal DIVi in which values j are the same values, values based on different data are inputted to the variable frequency divider 11 of each control unit 10-*i* as the frequency-division number setting value DCi.

Output signals CPO1 to CPOn outputted from each of the control units 10-1 to 10-*n* constituted as above are inputted to the adder 20 as illustrated in FIG. 1. The adder 20 adds the output signals CPO1 to CPOn and outputs an addition signal obtained as an addition result to the low-pass filter 30.

The low-pass filter (loop filter) 30 filters the addition signal (addition signal of output signals CPO1 to CPOn of the charge pump circuits 13 in the control units 10-1 to 10-*n*) outputted from the adder 20. The low-pass filter 30 smoothes the addition signal outputted from the adder 20 to remove a high frequency component and outputs the addition signal from which the high frequency component is removed to the voltage-controlled oscillator 40 as a control voltage.

The low-pass filter 30 is constituted similarly to the low-pass filter 103 illustrated in FIG. 12 for example. In other words, the low-pass filter 30 is constituted to include resistances Rs, Rr and capacitances Cs, Cp, Cr. An input signal (addition signal from the adder 20) is supplied to one end of the resistance Rs, one end of the resistance Rr, and one end of the capacitance Cp. A control voltage for controlling an oscillating frequency of the voltage-controlled oscillator 40 is outputted from a connection node of the other end of the resistance Rr and one end of the capacitance Cr. The other end of the resistance Rs is connected to one end of the capacitance Cs and the other ends of the capacitances Cs, Cp, Cr are grounded.

The voltage-controlled oscillator 40 outputs an output clock signal $f_{OUT}$ of a frequency corresponding to the inputted control voltage to an external circuit and to the control unit 10-*i*.

In the fractional-N PLL circuit in the present embodiment, the variable frequency divider 11 frequency-divides the output clock signal $f_{OUT}$ in the control unit 10-*i* by a frequency division ratio corresponding to the frequency division number setting value DCi thereby to output a frequency-divided clock signal DIVi. Further, the phase frequency comparator 12 compares the reference clock signal $f_{REF}$ and the frequency-divided clock signal DIVi and outputs a pulse signal corresponding to a comparison result to the charge pump circuit 13, and the charge pump circuit 13 outputs an output signal CPOi corresponding to the pulse signal. This operation is performed in each control unit 10-*i* by using frequency division number setting values DCi whose alignment (data pattern) is similar, with an initial value made different from one another.

Then, an output signal CPOi from each control unit 10-*i* is added by the adder 20, and thereafter smoothed by the low-pass filter 30 thereby to remove a high frequency component, an addition result supplied to the voltage-controlled oscillator 40 as a control voltage. The voltage-controlled oscillator 40 outputs an output clock signal $f_{OUT}$ of a frequency corresponding to the control voltage.

As described above, in the fractional-N PLL circuit in the present embodiment, if the frequency division number setting value DCi (variable frequency division setting value) is cycled in n periods of the frequency-divided clock signal DIVi, n pieces of control units 10-*i* are arranged in parallel. The frequency division number setting value DCi (variable frequency division setting value) is supplied to each control unit 10-*i* with initial values being different from one another, and each control unit 10-*i* performs a frequency division operation and a comparison operation, adding the output signal CPOi outputted from each of the control units 10-*i* to average the output signals CPOi, whereby oscillation control related to the output clock signal $f_{OUT}$ is performed.

As stated above, by arranging n pieces of control units 10-*i* in parallel and operating as above, a moving average filter is formed and a quantization noise can be reduced, so that occurrence of a spurious in the output clock signal $f_{OUT}$ due to the quantization noise can be suppressed.

It is noted that in the aforementioned description the data generator 14 and the adder 15 are provided in the control unit 10-*i* so that the frequency division number setting value DCi may be supplied to the variable frequency divider 11, but the present embodiment is not limited thereto. It suffices if setting information related to a frequency division ratio capable of setting a frequency division ratio to the variable frequency divider 11 can be supplied, and a constitution for supplying the setting information is optional. For example, the data generator 14 and the adder 15 can be provided outside the control unit 10-*i*. Further, it is possible not to provide a data generator 14 or an adder 15 and to supply a frequency number setting value DCi itself to a frequency divider 11 from the outside of the control unit 10-*i* for example. Further, for example, it is possible to provide an adder 15 in a control unit 10-*i* and to input a fixed frequency setting value M and a variable frequency setting value to the adder 15 from the outside of the control unit 10-*i* so that a frequency division number setting value DCi may be supplied to a variable control unit 11.

Figure 4:
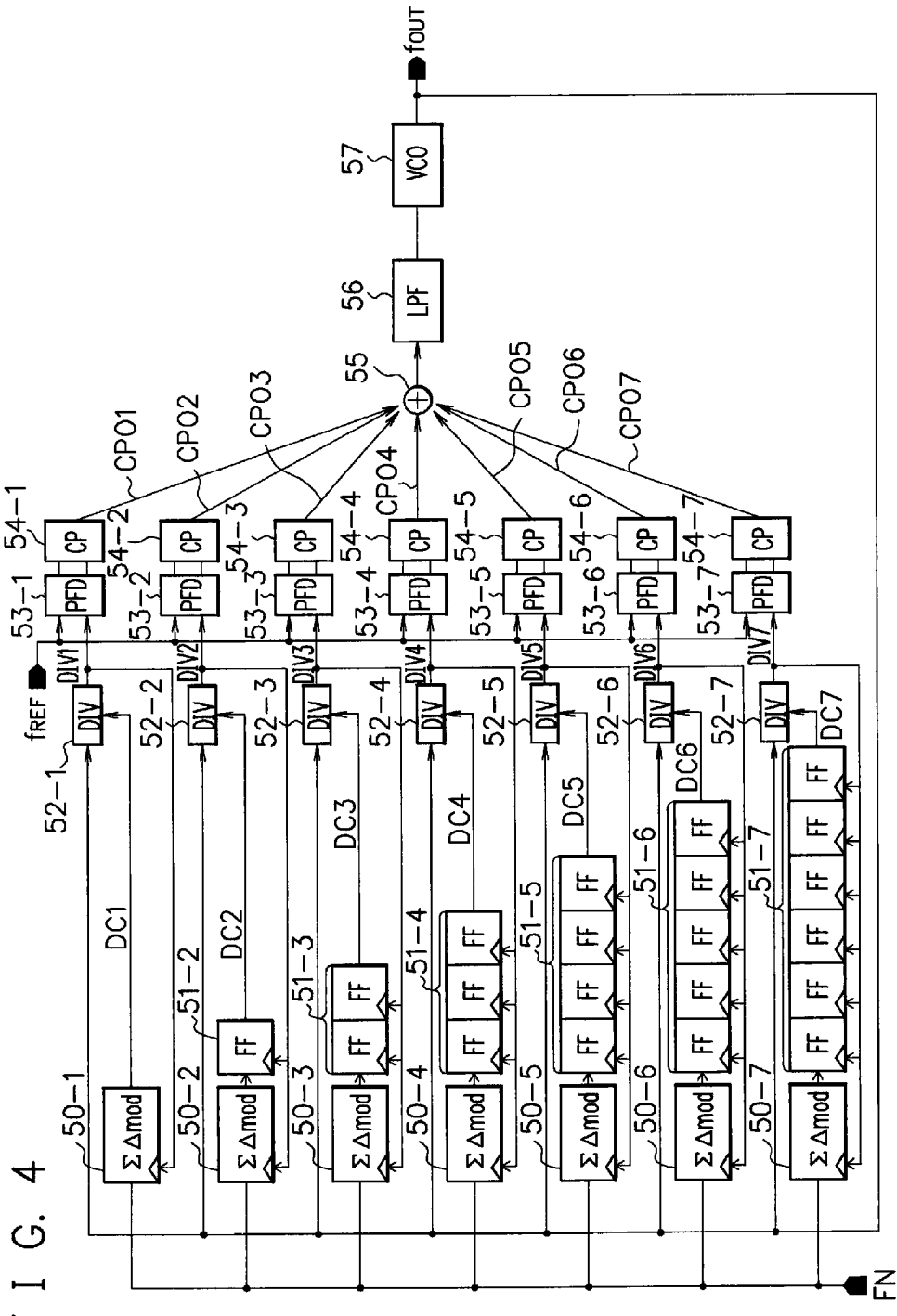
FIG. 4 is a diagram illustrating a concrete constitution example of the fractional-N PLL circuit in the present embodiment.

FIG. 4 is a block diagram illustrating a concrete constitution example of a fractional-N PLL circuit in the present embodiment. In FIG. 4 is illustrated a fractional-N PLL circuit in which a denominator value of a fractional frequency division ratio to be set is "7" (setting information related to a frequency division ratio given to a frequency divider is cycled in 7 periods of a frequency-divided clock signal).

In FIG. 4, reference numerals 50-1 to 50-7 indicate ΣΔ modulators (ΣΔ mod), reference numerals 51-2 to 51-7 indicate delay circuits, reference numerals 52-1 to 52-7 indicate variable frequency dividers (DIV), reference numerals 53-1 to 53-7 indicate phase frequency comparators (PFD), and reference numerals 54-1 to 54-7 indicate charge pump circuits (CP). Further, a reference numeral 55 indicates an adder, a reference numeral 56 indicates a low-pass filter (LPF), and a reference numeral 57 indicates a voltage-controlled oscillator (VCO).

The control unit 10-*i* illustrated in FIG. 1 is constituted by a combination of the ΣΔ modulator 50-*i*, the delay circuit 51-*i*, the variable frequency divider 52-*i*, the phase frequency comparator 53-*i*, and the charge pump circuit (CP) 54-*i*, in which the subscripts i (i=1 to 7) are the same (however, in a case of i=1, the delay circuit is not had).

The variable frequency dividers 52-1 to 52-7, the phase frequency comparators 53-1 to 53-7, and the charge pump circuits 54-1 to 54-7 illustrated in FIG. 4 correspond to the variable frequency divider 11, the phase frequency comparator 12, and the charge pump circuit 13 illustrated in FIG. 2, respectively, and redundant explanation will be omitted. Further, the adder 55, the low-pass filter 56, and the voltage-controlled oscillator 57 illustrated in FIG. 4 correspond to the adder 20, the low-pass filter 30, and the voltage-controlled oscillator 40 illustrated in FIG. 1, respectively, and redundant explanation will be omitted.

To the ΣΔ modulators (called also ΔΣ modulators) 50-1 to 50-7, fractional setting information FN related to frequency division setting is inputted and the frequency-divided clock signals DIV1 to DIV7 outputted from the variable frequency divider 52-1 to 52-7 are inputted. The ΣΔ modulators 50-1 to 50-7 operate the frequency-divided clock signals DIV1 to DIV7 inputted thereto as clock signals, output a modulation output illustrated in FIG. 5A and FIG. 5B in correspondence with the fractional setting information FN in synchronization with the frequency-divided clock signals DIV1 to DIV7. For example, in a case that a third order MASH type ΣΔ modulators are used as the ΣΔ modulators 50-1 to 50-7, with regard to every modulation output for realizing the fractional frequency division ratio whose denominator value is "7", it is possible to output specific patterns in 7 periods.

Figure 5A:
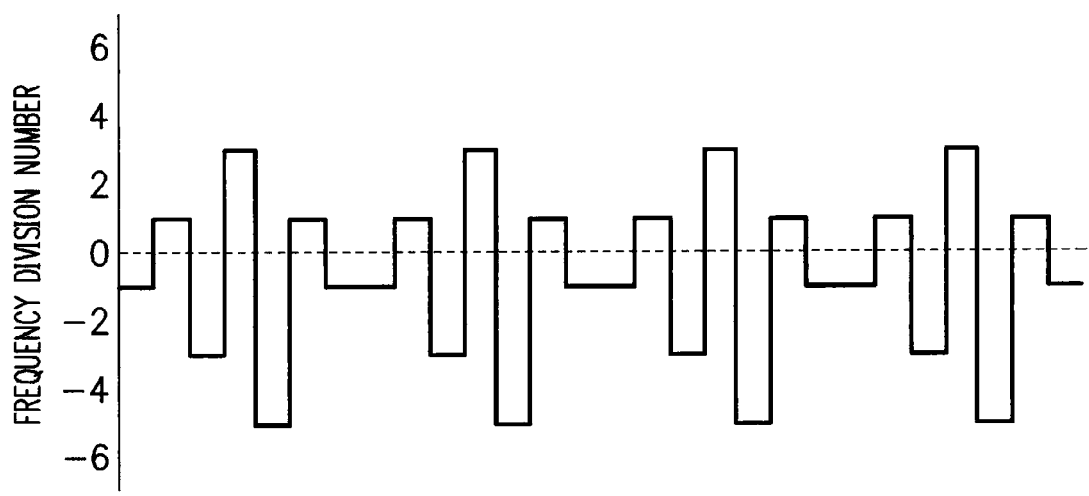
FIG. 5A and FIG. 5B are graphs illustrating output examples of a $\Sigma\Delta$ modulator.
Figure 5B:
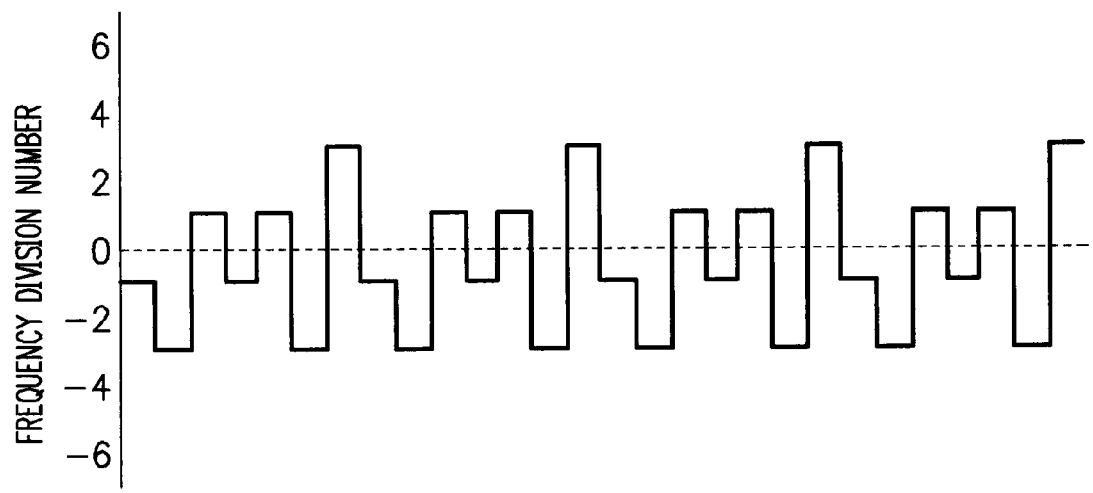

FIG. 5A and FIG. 5B are diagrams illustrating examples of outputs of a ΣΔ modulator.

A pattern illustrated in FIG. 5A is an example of an output pattern to realize (2/7), in which {−1, 1, −3, 3, −5, 1, −1} is outputted repeatedly (in cycle) as a modulation output. Further, a pattern illustrated in FIG. 5B is an example of an output pattern to realize (4/7), in which {−1, −3, 1, −1, 1, −3, 3} is outputted repeatedly (in cycle) as a modulation output.

Back to FIG. 4, to the delay circuits 51-2 to 51-7, modulation outputs outputted from the ΣΔ modulators 50-2 to 50-7 are inputted and frequency-divided clock signals DIV2 to DIV7 outputted from the variable frequency divider 52-2 to 52-7 are inputted. The delay circuits 51-2 to 51-7 operate the inputted frequency-divided clock signals DIV1 to DIV7 as clock signals and delays the modulation outputs from the ΣΔ modulators 50-2 to 50-7 by a predetermined time (time period of a predetermined period number) and output the modulation outputs. It should be noted that the delay circuits 51-2 to 51-7 are constituted so that delay times (period numbers to delay) are different from one another.

The delay circuits 51-2 to 51-7 are constituted, by using flip-flop(s) (FF(s)) to whose clock input terminals the frequency-divided clock signals DIV2 to DIV7 are supplied for example, by cascade-connecting flip-flop(s) of the number corresponding to a period number to be delayed. In the example illustrated in FIG. 4, the delay circuit 51-2 is constituted by one flip-flop to whose clock input terminal the frequency-divided clock signal DIV2 is supplied, while the delay circuit 51-3 is constituted by two flip-flops to whose clock input terminal the frequency-divided clock signal DIV3 is supplied. Similarly, the delay circuit 51-$p$ (p=2 to 7) is constituted by cascade-connecting (p−1) pieces of flip-flops to whose clock input terminal a frequency-divided clock signal DIV$p$ is supplied.

According to the aforementioned constitution, when the ΣΔ modulators 50-1 to 50-7 output {−1, 1, −3, 3, −5, 1, −1} representing (2/7) as a modulation out in correspondence with fractional setting information FN for example, a value as a fractional component related to the frequency division ratio in data pattern of {−1, 1, −3, 3, −5, 1, −1} is supplied to the variable frequency divider 52-1. Further, a value as a fractional component related to the frequency division ratio in data pattern of {−1, −1, 1, −3, 3, −5, 1} is supplied to the variable frequency divider 52-2 due to delay by one period, while a value as a fractional component related to the frequency division ratio in data pattern of {1, −1, −1, 1, −3, 3, −5,} is supplied to the variable frequency divider 52-3 due to delay by two periods. A value as a fractional component related to the frequency division ratio in data pattern of {−5, 1, −1, −1, 1, −3, 3} is supplied to the variable frequency divider 52-4 due to delay by three periods, while a value as a fractional component related to the frequency division ratio in data pattern of {3, −5, 1, −1, −1, 1, −3} is supplied to the variable frequency divider 52-5 due to delay by four periods. A value as a fractional component related to the frequency division ratio in data pattern of {−3, 3, −5, 1, −1, −1, 1} is supplied to the variable frequency divider 52-6 due to delay by five periods, while a value as a fractional component related to the frequency division ratio in data pattern of {1, −3, 3, −5, 1, −1, −1} is supplied to the variable frequency divider 52-7 due to delay by six periods. As stated above, values as the fractional components related to the frequency division ratio are supplied to the variable frequency divider 52-1 to 52-7 with initial values made different from one another (with specific initial values) of similarly aligned data patterns.

It is noted that FIG. 4 illustrates about the fractional component related to the frequency division ratio, and in FIG. 4, with the modulation outputs of the ΣΔ modulators 50-1 to 50-7 being variable frequency division setting value, a frequency division number setting value DCi made by adding a fixed frequency division setting value M and a variable frequency division setting value as illustrated in FIG. 2 is supplied to the variable frequency divider 11. Here, an addition processing of the fixed frequency division setting value M and the variable frequency division setting value can be performed in a previous stage of the delay circuits 51-2 to 51-7 or can be performed in a subsequent stage.

Figure 6:
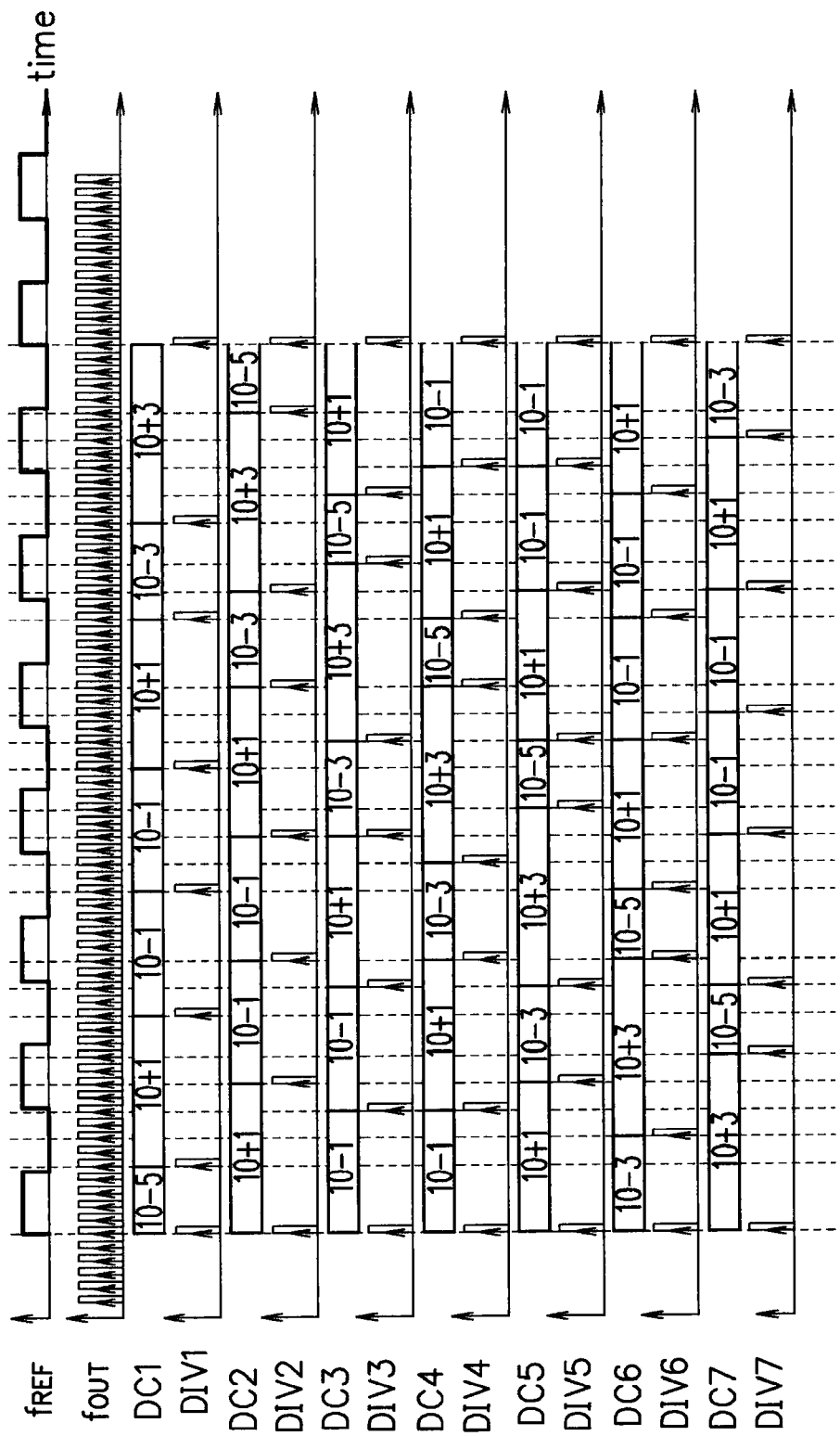
FIG. 6 is a timing chart illustrating an operation example of a fractional-N PLL circuit in the present embodiment.
Figure 7:
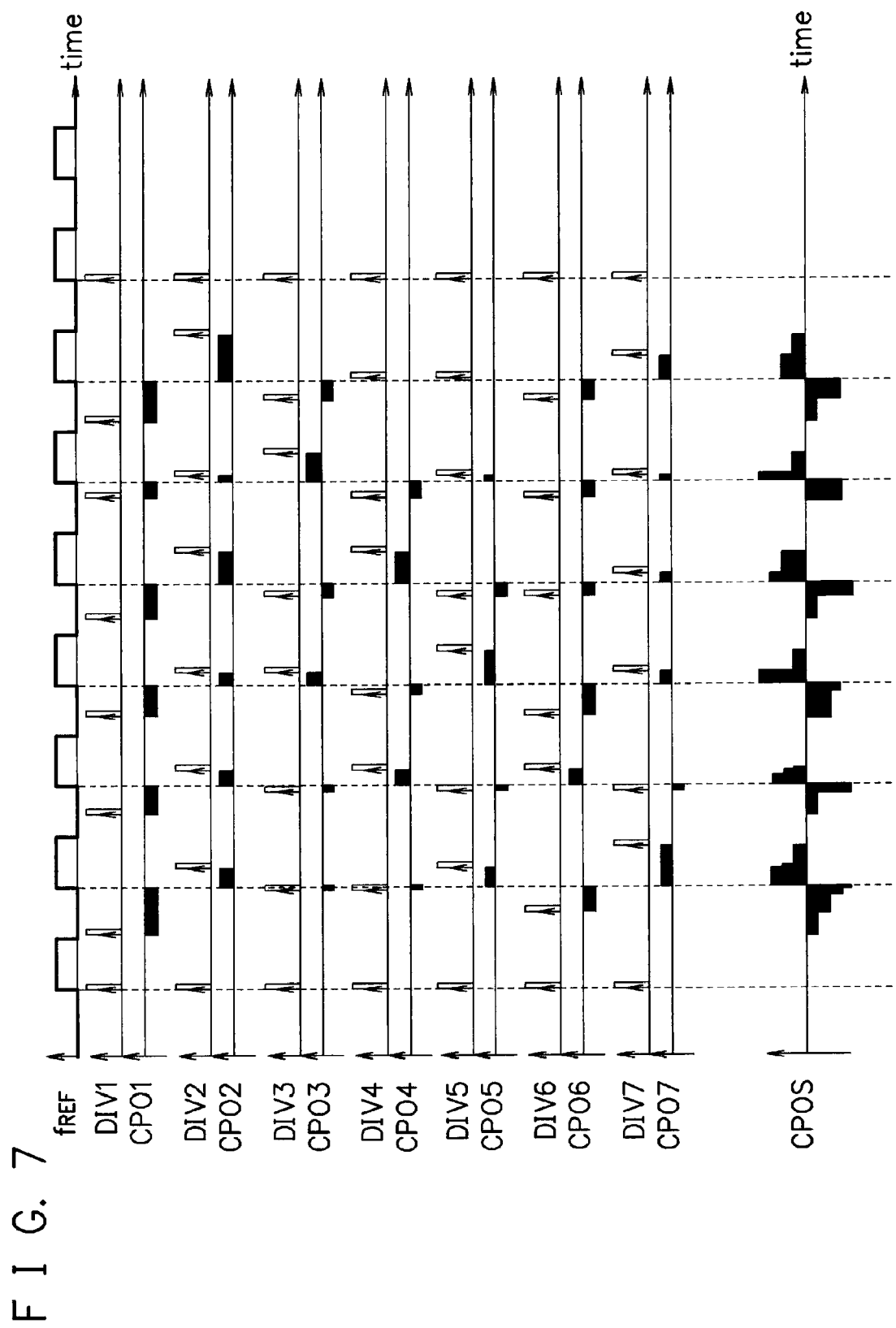
FIG. 7 is a timing chart illustrating an operation example of a fractional-N PLL circuit in the present embodiment.

FIG. 6 and FIG. 7 are timing charts illustrating operation examples of the fractional-N PLL circuit in the present embodiment. In FIG. 6 and FIG. 7, there is illustrated as an example a case in which the fixed frequency division setting value M is "10" and the data pattern (equivalent to 2/7) of {−5, 1, −1, −1, 1, −3, 3} is supplied as the variable frequency division setting value, and it is presumed that a sufficient time has passed since an operation is started and the operation is stable.

In FIG. 6 and FIG. 7, $f_{REF}$ indicates a reference clock signal inputted to the fractional-N PLL circuit, while $f_{OUT}$ indicates an output clock signal outputted from the fractional-N PLL circuit. Further, DCi indicates a frequency division number setting value supplied to the variable frequency divider 11 in the control unit 10-$i$, DIVi indicates a frequency-divided clock signal outputted from the variable frequency divider 11 in the control unit 10-$i$, CPOi indicates an output signal outputted from the control unit 10-$i$, and CPOS indicates a total sum of the output signals CPOi.

As illustrated in FIG. 6, in the first period of the frequency-divided clock signal DIVi, "−5" is supplied to the variable frequency divider 11 in the control unit 10-1 as a variable frequency division setting value, while "1" is supplied to the variable frequency divider 11 in the control unit 10-2 as a variable frequency division setting value. Similarly, "−1", "−1", "1", "3" are supplied to the variable frequency divider 11 in each of the control units 10-3, 10-4, 10-5, 10-6, 10-7 as variable frequency division setting values. In other words, in the first period of the frequency-divided clock signal DIVi, each value of the data pattern of data pattern of {−5, 1, −1, −1, 1, −3, 3} is supplied to the variable frequency divider 11 in each control unit 10-$i$ as an initial value of the variable frequency division setting value.

Thereafter, in the control unit 10-1 for example, the value supplied as the variable frequency division setting value by the frequency clock signal DIV1 obtained by frequency-dividing the output clock signal $f_{OUT}$ in correspondence with the frequency division number setting value (10-5) is switched to "1" in the next. Further, the frequency-divided clock signal DIV1 and the reference clock signal $f_{REF}$ are compared by the phase frequency comparator 12, and in correspondence with a comparison result thereof, an output signal CPO1 is outputted from the charge pump 13 as illustrated in FIG. 7.

The output signal CPOi outputted based on the aforementioned operation in each control unit 10-$i$ is added, an addition signal CPOS is supplied to the voltage-controlled oscillator 40 as a control voltage via the low-pass filter, and frequency control related to the output clock signal $f_{OUT}$ being an oscillation output is performed. Here, as illustrated in FIG. 7, when the addition signal CPOS is integrated, its value becomes "0" in one period of the reference clock signal $f_{REF}$.

In other words, when a denominator value of a fractional frequency division ratio to be set is "7" (setting information related to a frequency division ratio is cycled in 7 periods of a frequency-divided clock signal), averaging is performed spending a time period equivalent to seven periods of the reference clock signal $f_{REF}$ in the fractional-N PLL circuit illustrated in FIG. 12. In contrast, in the fractional-N PLL circuit in the present embodiment, an average processing can be performed only in a time period equivalent to one period of a reference clock signal $f_{REF}$, so that occurrence of a spurious in an output clock signal $f_{OUT}$ can be suppressed.

According to the present embodiment, in a fractional-N PLL circuit, when a frequency division number setting value DCi (variable frequency division setting value) is cycled in n periods of the frequency-divided clock signal DIVi, n pieces of control units 10-$i$ are arranged in parallel. Then, the frequency division number setting value DCi (variable frequency division setting value) is supplied to each control unit 10-$i$ with an initial value made different from one another, a frequency division operation and a comparison operation are performed, and thereafter an output signal CPOi outputted from each control unit 10-$i$ is added, whereby oscillation control related to an output clock signal $f_{OUT}$ is performed. As stated above, arranging n pieces of control units 10-$i$ in parallel and operating as above leads to formation of a moving average filter, enabling reduction of a quantization noise. Therefore, it is possible to suppress occurrence of a spurious in an output clock signal $f_{OUT}$ due to a quantization noise without increasing a capacitance value of a capacitance in a low-pass filter 30.

Figure 8A:
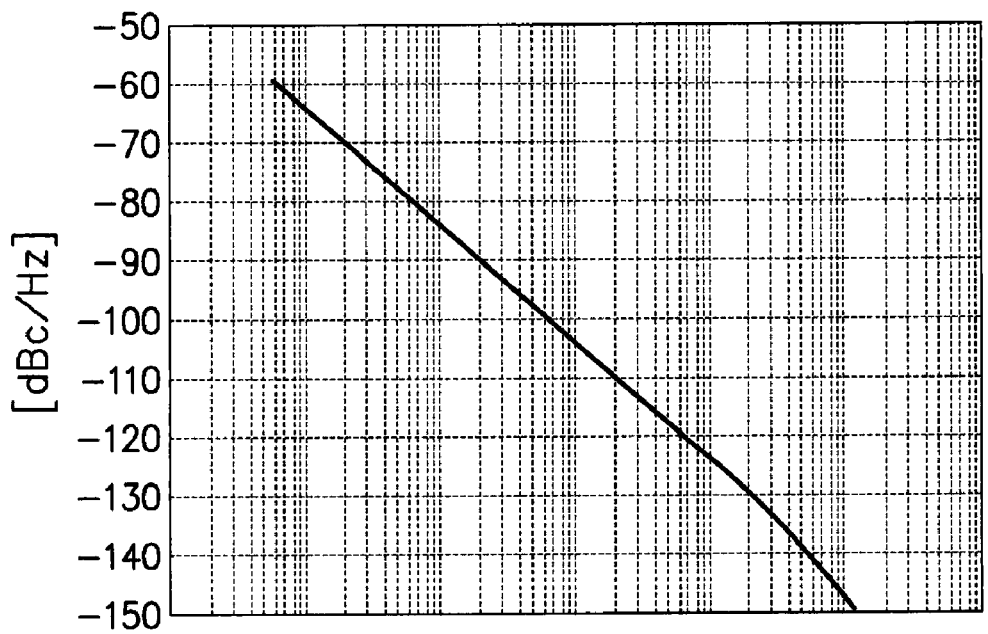
FIG. 8A and FIG. 8B are graphs illustrating spectra of output signals of a fractional-N PLL circuit in the present embodiment.
Figure 8B:
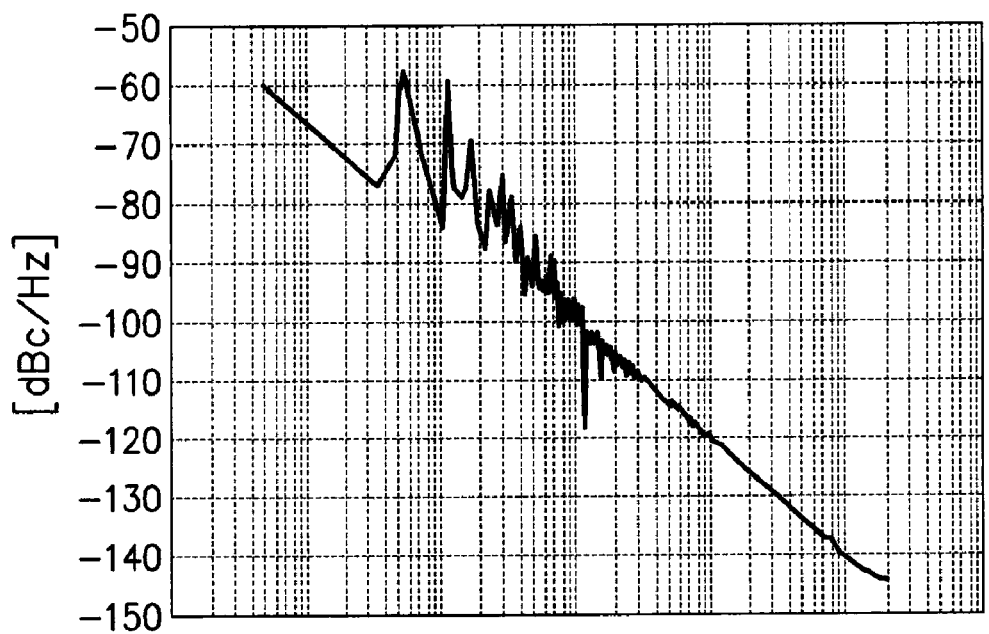

According to the fractional-N PLL circuit in the present embodiment, a nuisance in a specific period in an oscillation output does not occur, and as is obvious compared with a spectrum of an output signal of the conventional fractional-N PLL illustrated in FIG. 8B, it is possible to suppress occurrence of a spurious as illustrated in an example of a spectrum of an output signal illustrated in FIG. 8A to obtain a good oscillation output.

Figure 9:
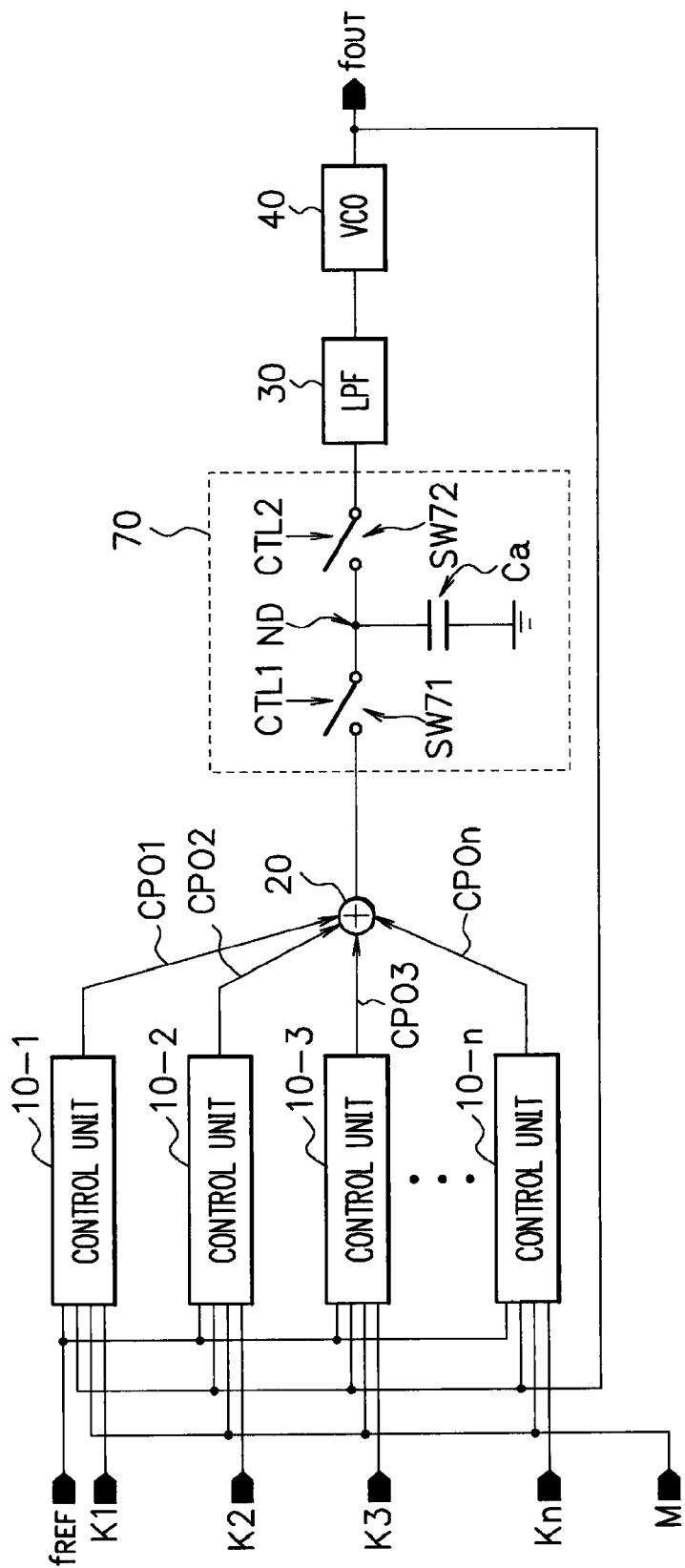
FIG. 9 is a diagram illustrating another constitution example of the fractional-N PLL circuit in the present embodiment.

FIG. 9 is a block diagram illustrating another constitution example of the fractional-N PLL circuit in the present embodiment. In FIG. 9, there is illustrated as an example a fractional-N PLL circuit in which a denominator value of a fractional frequency division ratio to be set is n (n is a natural number) and in which setting information related to a frequency division ratio given to a frequency divider is cycled in n periods of a frequency-divided clock signal outputted from the frequency divider. It is noted that in FIG. 9, a block and the like having the same function as that of a block and the like illustrated in FIG. 1 is given the same reference numeral, and redundant description will be omitted.

In the aforementioned fractional-N PLL circuit in the present embodiment, the addition signal CPOS made by adding the output signal CPOi from each control unit 10-$i$ changes as illustrated in FIG. 7 for example. This addition signal CPOS is supplied to the voltage-controlled oscillator 40 via the low-pass filter as a control voltage. As stated above, in the aforementioned fractional-N PLL circuit, by a result of one phase comparison in each control unit 10-$i$, a positive-polarity pulse signal and a negative-polarity pulse signal simultaneously occur in the addition signal CPOS and the positive pulse signal and the negative pulse signal are supplied to the voltage-controlled oscillator 40 as a control voltage. In other words, in the PLL circuit, by one phase comparison, an UP pulse signal and a DOWN pulse signal simultaneously occur. As a result, there is a possibility that a spurious due to simultaneous occurrence of an UP pulse signal and a DOWN pulse signal occurs in an oscillation output of a voltage-controlled oscillator 40 frequency-controlled by those pulse signals.

Thus, in a fractional-N PLL circuit illustrated in FIG. 9, a capacitance circuit 70 is provided between an output terminal of an adder 20 and an input terminal of a low-pass filter 30. The capacitance circuit 70 once accumulate an addition signal CPOS (charge by the addition signal CPOS) outputted from the adder 20, and thereafter, supplies to the low-pass filter 30.

The capacitance circuit 70 has a capacitance Ca and switches SW71, SW72. One end of the switch SW71 is connected to the output terminal of the adder 20 and the other end thereof is connected to one end of the switch SW72. The other terminal of the switch SW72 is connected to the input terminal of the low-pass filter 30. The switches SW71 and SW72 are on/off controlled by control signals CTL1, CTL2 having the same frequency as that of a reference clock signal $f_{REF}$. However, phases of the control signals CTL1, CTL2 are shifted from each other. One end of the capacitance Ca is connected to a connection node ND of the other end of the switch SW71 and one end of the switch SW72, and the other end thereof is grounded.

Figure 10:
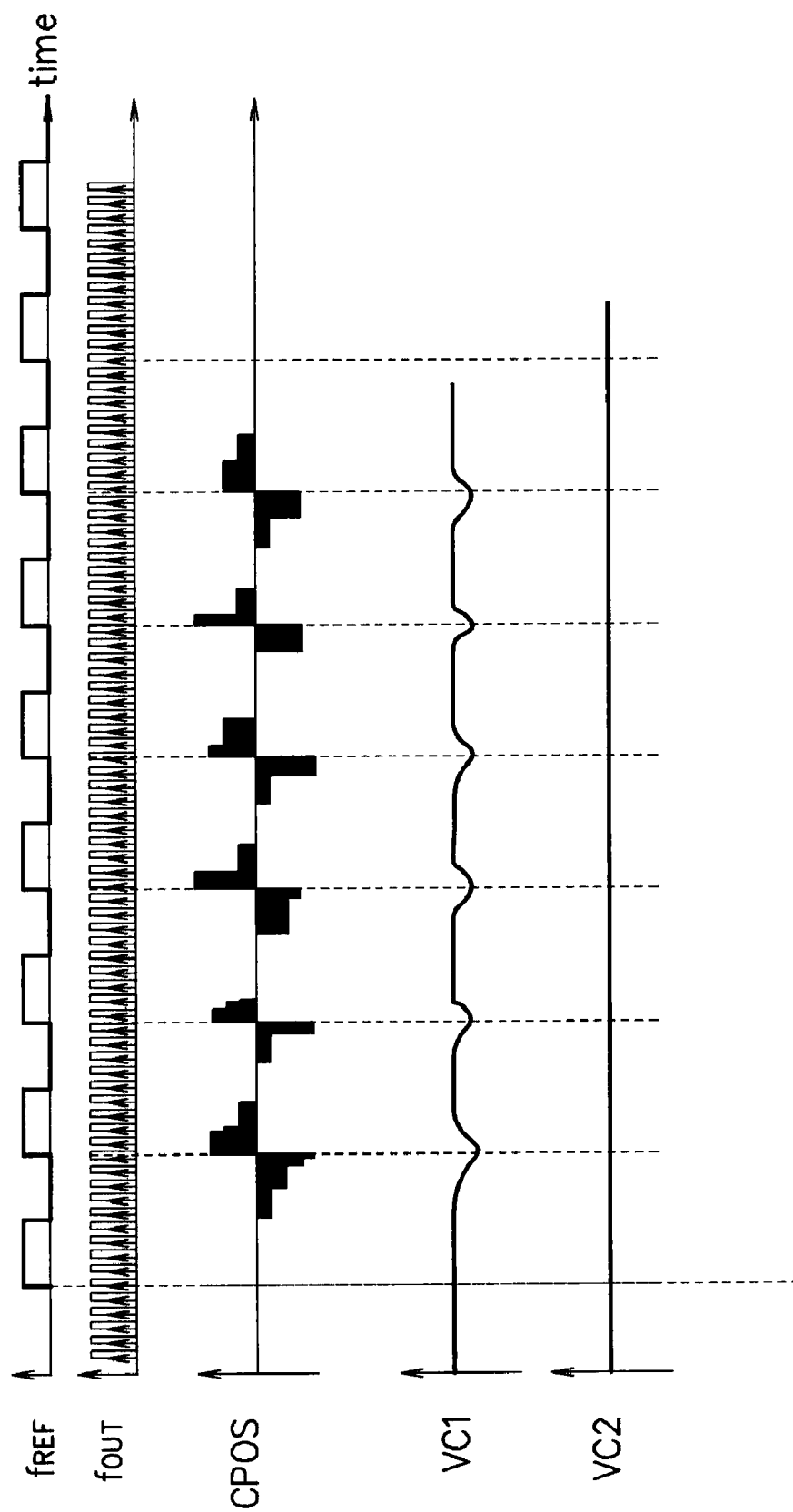
FIG. 10 is a graph illustrating an operation example of the fractional-N PLL circuit illustrated in FIG. 9.

The capacitance circuit 70 makes the switch SW71 in an ON state by the control signal CTL1 and makes the switch SW72 in an OFF state by the control signal CTL2 thereby to accumulate the addition signal CPOS (charge by the addition signal CPOS) from the adder 20 in the capacitance Ca. Thereby, when an electric potential of a node ND in a capacitance circuit 70 is VC1, the electric potential VC1 changes as illustrated in FIG. 10.

Then, at a timing that the addition signal CPOS from the adder 20 is "0" (pulse signal does not occur), in other words, when the electric potential VC1 does not change and maintains its level, the switch SW72 is made in an ON state (for example, turned on in a pulse state) by the control signal CTL2. Thereby, a signal generated based on the addition signal CPOS from the adder 20 and inputted to the low-pass filter 30, that is, a signal supplied to the voltage-controlled oscillator 40 via the low-pass filter 30 as a control voltage, becomes a signal VC2 illustrated in FIG. 10.

As stated above, the capacitance circuit 70 is provided between the adder 20 and the low-pass filter 30, and the addition signal CPOS from the adder 20 is once accumulated in the capacitance circuit 70 and thereafter supplied to the low-pass filter 30. Thereby, in the signal supplied to the voltage-controlled oscillator 40 as a control voltage, simultaneous occurrence of a positive-polarity pulse signal and a negative-polarity pulse signal can be prevented, whereby occurrence of a spurious in an output clock signal $f_{OUT}$ due to simultaneous occurrence of the positive pulse signal and the negative pulse signal can be suppressed.

Figure 11:
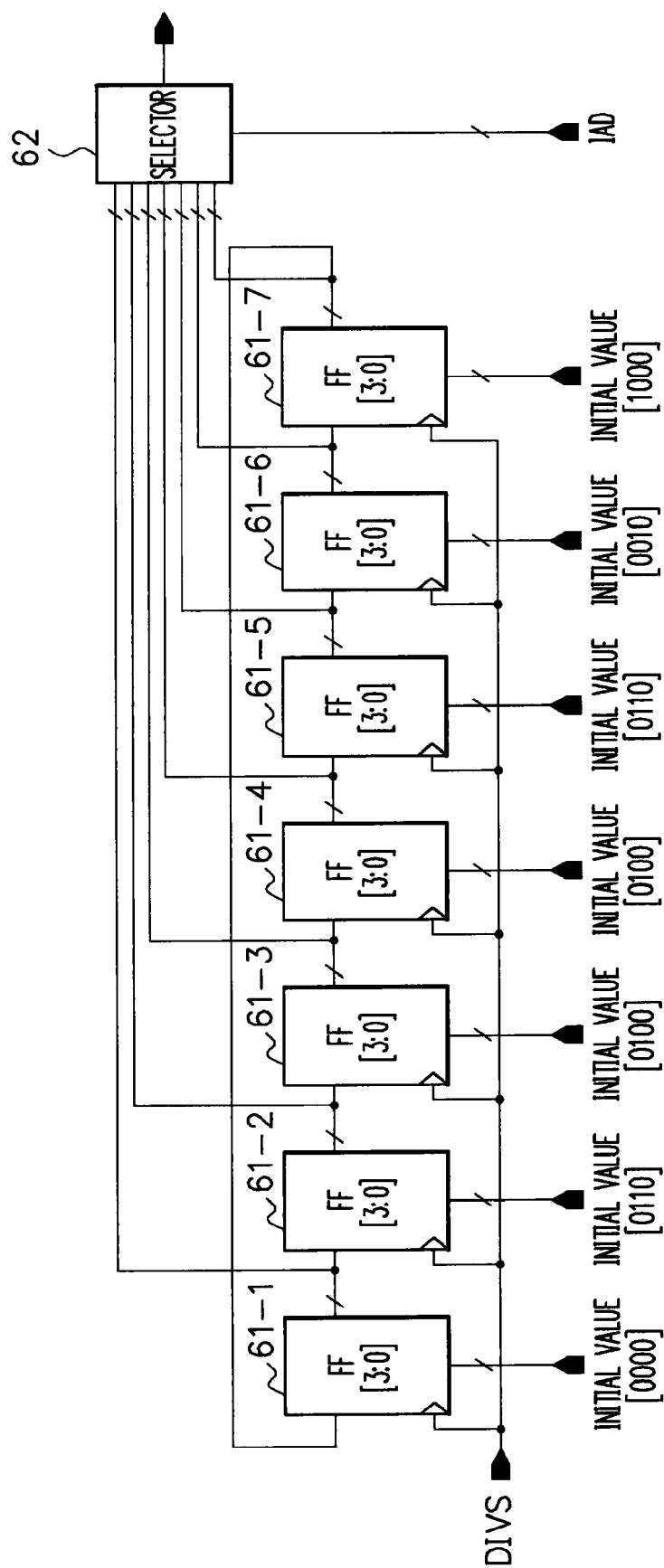
FIG. 11 is a diagram illustrating another constitution example of data generator in the present embodiment.

It is noted that in the aforementioned explanation, there is described an example in which the data generator 14 in the control unit of the fractional-N PLL circuit in the present embodiment is constituted by the ΣΔ modulator and the delay circuit, but the present embodiment is not limited thereto. For example, the data generator 14 can be constituted by using a shift register. For example, flip-flops 61-1 to 61-7 in which initial values cited in FIG. 11 can be selected (can be set) are cascade-connected and a value supplied as a variable frequency division setting value is set as an initial value of each of the flip-flops 61-1 to 61-7. Further, a frequency-divided clock signal DIVS is supplied to each of the flip-flops 61-1 to 61-7 and a value is transmitted to flip-flops 61-1 to 61-7 in a next stage in correspondence with the frequency-divided clock signal DIVS and cycled. Then, one output of the flip-flops 61-1 to 61-7 is selected by a selector 62 in correspondence with an initial value address IAD and outputted as a variable frequency division setting value, whereby a function as a data generator 14 can be realized.

According to the present embodiment, by arranging N pieces of control circuit sections and supplying setting information related to a frequency division ratio with an initial value made different from one another to each control circuit section to perform a frequency division operation and a comparison operation, a moving average filter is formed and a quantization noise can be reduced. Thereby, occurrence of a spurious in an output clock signal outputted from a voltage-controlled oscillator can be suppressed without increasing a capacitance value of a capacitance in a low-pass filter.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A semiconductor device comprising:
a voltage-controlled oscillator outputting an output clock signal;
N pieces (N is a natural number equal to or more than 2) of control circuit sections being inputted a reference clock signal and the output clock signal;
an adder adding output signals outputted from each of the N pieces of control circuit sections; and
a low-pass filter filtering an output of the adder and outputting to the voltage-controlled oscillator,
wherein the control circuit section comprises:
a variable frequency divider to which setting information related to a frequency division ratio is supplied and which frequency-divides the output clock signal at a frequency division ratio corresponding to the setting information and outputs a frequency-divided clock signal;
a phase frequency comparator comparing the reference clock signal and the frequency-divided clock signal; and
a charge pump circuit outputting the output signal based on a comparison result in the phase frequency comparator,
wherein the setting information related to the frequency division ratio is N pieces of data which are cycled and supplied in a sequence in synchronization with the frequency-divided clock signal outputted from the variable frequency divider to which the setting information is supplied and in which the frequency division ratio of the variable frequency divider is fluctuated by synchronizing a frequency division ratio set by each data with the frequency-divided clock signal so that an average frequency division ratio may include a decimal fraction, and
wherein the setting information having N pieces of data is supplied to the respective variable frequency divider of the control circuit section with initial values thereof made different from one another.

2. The semiconductor device according to claim 1, comprising:
a capacitance circuit accumulating the output of the adder and supplying to the low-pass filter.

3. The semiconductor device according to claim 1, comprising:
a data generation circuit section generating the setting information related to the frequency division ratio.

4. The semiconductor device according to claim 3, wherein the data generation circuit section comprises:
a data generator generating a variable frequency division setting value related to fractional component of the average frequency division ratio in the variable frequency divider; and
an adder adding the variable frequency division setting value generated by the data generation section and a fixed frequency division setting value which is inputted from the outside and a value thereof is fixed, and outputting as the setting information related to the frequency division ratio.

5. The semiconductor device according to claim 3,
wherein the data generation circuit section is disposed in each of the control circuit sections, the N pieces of data of the setting information related to the frequency division ratio are stored in the data generation circuit section, one piece of data is selected from the N pieces of data as the initial value in correspondence with an address inputted from the outside thereby to supply the setting information related to the frequency division ratio, and the address is made different from one another and inputted to each of the control circuits.

6. The semiconductor device according to claim 3,
wherein the data generation circuit section comprises:
a data generator generating the setting information related to the frequency division ratio with the initial value made the same; and
a delay circuit delaying the setting information related to the frequency division ratio generated by the data generator by a time period equal to a predetermined frequency of the frequency-divided clock signal and supplying to the variable frequency divider, and
a delay frequency in the delay circuit is different from one another for each of the control circuit sections.

7. The semiconductor device according to claim 3,
wherein the data generation circuit section comprises:
a ΣΔ modulator.

8. The semiconductor device according to claim 3,
wherein the data generation circuit section comprises:
a shift register.

9. A semiconductor device comprising:
a voltage-controlled oscillator outputting an output clock signal;

N pieces (N is a natural number equal to or more than 2) of control circuit sections being inputted a reference clock signal and the output clock signal are inputted;

an adder adding output signals outputted from each of the N pieces of control circuit sections; and a low-pass filter filtering an output of the adder and outputting to the voltage-controlled oscillator, wherein the control circuit section comprises:

a variable frequency divider frequency-dividing the output clock signal at a frequency division ratio corresponding to setting information related to a frequency division ratio and outputting a frequency-divided clock signal;

a phase frequency comparator comparing the reference clock signal and the frequency-divided clock signal;

a charge pump circuit outputting the output signal based on a comparison result in the phase frequency comparator; and a delay circuit delaying setting information related to the frequency division ratio inputted from the outside by a time period equal to a predetermined frequency of the frequency-divided clock signal and supplying to the variable frequency divider, wherein the setting information related to the frequency division ratio is N pieces of data which are cycled and supplied in a sequence in synchronization with the frequency-divided clock signal outputted from the variable frequency divider to which the setting information is supplied and in which the frequency division ratio of the variable frequency divider is fluctuated by synchronizing a frequency division ratio set by each data with the frequency-divided clock signal so that an average frequency division ratio may include a decimal fraction, and wherein a delay frequency in the delay circuit is different from one another for each of the control circuit sections.

10. The semiconductor device according to claim 9, comprising:

a capacitance circuit accumulating the output of the adder and supplying to the low-pass filter.

* * * * *